United States Patent
Sudo

(10) Patent No.: US 7,585,720 B2
(45) Date of Patent: Sep. 8, 2009

(54) DUAL STRESS LINER DEVICE AND METHOD

(75) Inventor: Gaku Sudo, Yokohama (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 158 days.

(21) Appl. No.: 11/428,692

(22) Filed: Jul. 5, 2006

(65) Prior Publication Data

US 2008/0050869 A1 Feb. 28, 2008

(51) Int. Cl.
*H01L 21/4763* (2006.01)

(52) U.S. Cl. ............... 438/199; 438/233; 438/236; 438/279; 438/305; 257/E21.002; 257/E21.214; 257/E21.217; 257/E21.301; 257/E21.576

(58) Field of Classification Search .......... 438/197, 438/199, 228, 233, 279, 305; 257/E21.002, 257/211, 214, 336, 414, 576, 583, 597
See application file for complete search history.

(56) References Cited

U.S. PATENT DOCUMENTS

| | | | | |
|---|---|---|---|---|
| 5,841,170 | A * | 11/1998 | Adan et al. | 257/345 |
| 6,046,494 | A * | 4/2000 | Brigham et al. | 257/640 |
| 6,573,172 | B1 * | 6/2003 | En et al. | 438/626 |
| 6,825,529 | B2 * | 11/2004 | Chidambarrao et al. | 257/336 |
| 6,939,814 | B2 * | 9/2005 | Chan et al. | 438/778 |
| 7,022,561 | B2 * | 4/2006 | Huang et al. | 438/197 |
| 7,060,549 | B1 * | 6/2006 | Craig et al. | 438/199 |
| 7,101,744 | B1 * | 9/2006 | Dyer et al. | 438/197 |
| 7,115,954 | B2 * | 10/2006 | Shimizu et al. | 257/369 |
| 7,187,038 | B2 * | 3/2007 | Morin et al. | 257/369 |
| 7,193,254 | B2 * | 3/2007 | Chan et al. | 257/274 |
| 7,205,615 | B2 * | 4/2007 | Tsutsui et al. | 257/369 |
| 7,214,629 | B1 * | 5/2007 | Luo et al. | 438/778 |
| 7,220,630 | B2 * | 5/2007 | Cheng et al. | 438/199 |
| 7,244,644 | B2 * | 7/2007 | Zhu et al. | 438/199 |
| 7,279,746 | B2 * | 10/2007 | Doris et al. | 257/338 |
| 7,288,451 | B2 * | 10/2007 | Zhu et al. | 438/228 |
| 7,309,637 | B2 * | 12/2007 | Lee et al. | 438/303 |
| 7,314,836 | B2 * | 1/2008 | Golonzka et al. | 438/761 |
| 7,396,718 | B2 * | 7/2008 | Frohberg et al. | 438/233 |
| 7,402,885 | B2 * | 7/2008 | Sudo | 257/509 |
| 7,417,289 | B2 * | 8/2008 | Tsutsui et al. | 257/369 |
| 7,462,527 | B2 * | 12/2008 | Conti et al. | 438/199 |
| 7,521,307 | B2 * | 4/2009 | Zhu et al. | 438/199 |
| 7,528,028 | B2 * | 5/2009 | Liang et al. | 438/199 |
| 2003/0040158 | A1 * | 2/2003 | Saitoh | 438/279 |
| 2003/0181005 | A1 * | 9/2003 | Hachimine et al. | 438/231 |

(Continued)

OTHER PUBLICATIONS

H. S. Yang, et al., "Dual Stress Liner for High Performance sub-45nm Gate Length SOI CMOS Manufacturing", IEEE 2004; IEDM 04, pp. 1075-1077.

*Primary Examiner*—Michael S Lebentritt
(74) *Attorney, Agent, or Firm*—Banner & Witcoff, Ltd.

(57) ABSTRACT

A dual stress liner manufacturing method and device is described. Overlapping stress liner layers of opposite effect (e.g., tensile versus compression) may be deposited over portions of the device, and the uppermost overlapping layer may be polished down in a process that uses the bottom overlapping layer as a stopper. An insulating film may be deposited on the stress liner layers before the polishing, and another insulating film may be deposited above the first insulating film after the polishing. Contacts may be formed such that the contacts need only penetrate one stress liner layer to reach a transistor well or gate structure.

20 Claims, 3 Drawing Sheets

U.S. PATENT DOCUMENTS

| | | | |
|---|---|---|---|
| 2007/0018328 A1* | 1/2007 | Hierlemann et al. | 257/762 |
| 2007/0099360 A1* | 5/2007 | Lee et al. | 438/197 |
| 2007/0108529 A1* | 5/2007 | Huang et al. | 257/368 |
| 2007/0194382 A1* | 8/2007 | Miyashita et al. | 257/364 |
| 2009/0014807 A1* | 1/2009 | Tang et al. | 257/369 |

* cited by examiner

DUAL STRESS LINER DEVICE AND METHOD

BACKGROUND

The use of strained silicon in the manufacturing of semiconductor devices has gained popularity as an effective way to improve conductance in the transistors of such devices. Early efforts at using strained silicon involved embedding silicon-germanium in a silicon layer on opposing sides of a transistor channel region, which caused the silicon atoms in the channel layer to "stretch" in a natural attempt to align with the structure of the silicon-germanium.

The Si—Ge approach is helpful for increasing conductance, which benefits n-type field-effect transistors (FETs, or NFETs), but p-type FETs, or PFETs, did not benefit from the stretched channels. Instead, p-type FETs benefit from the opposite—a more compressed silicon lattice structure in their channel regions. Accordingly, dual stress liner devices have been developed that allow n-type and p-type devices to both enjoy the benefits of strained silicon.

FIG. 1 illustrates an example of a current approach to such dual stress liner devices. On the semiconductor substrate 100, transistor structures such as silicide 101 may be formed, and an isolation structure (e.g., shallow trench isolation 102) may be formed to electrically separate transistors from each other. For example, NFET devices may be formed in a p-well on the left, and PFET may be formed in an n-well on the right. Transistor gate structures 103, such as gate electrodes, gate layers, insulation layers, sidewall spacers, etc. and additional silicide 104 and 105 may be formed as well. Silicide 105 and gate structure may be used as interconnects in regions over the isolation structure 102.

To provide the dual stresses, a tensile stress film 106 may be formed over one region (e.g., an NFET region), while a compressive stress film 107 may be formed over the other region (e.g., a PFET region). Lining up these films at the boundary results in either an overlap (as shown) or a gap (not shown) between the two films. Because leaving a gap would expose the interconnect gate 105 to additional etching when forming contact structures 108a,b, an overlap of the two films is generally preferred.

When forming contact structures 108a,b, careful control over the etching process (e.g., reactive ion etching) is needed to ensure that the structures 108a,b penetrate to the appropriate depth. Since some structures 108a need to penetrate two stress films, while other structures 108b need only penetrate through one stress film, the formation of structures 108a,b is a difficult process.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A dual stress liner semiconductor device may be manufactured by forming transistors in and on a semiconductor substrate, and then forming two stress liners on different regions of the device. The stress liners may be of opposite effect (e.g., one tensile, the other compression), and the liners may overlap.

A polishing process, such as chemical and/or mechanical polishing, may be used to remove an overlapping portion of one of the stress liners. The polishing process may use the other stress liner as a stopper. Contacts may then be formed, where each contact need only penetrate one stress liner (even a contact formed where the overlap occurred). A contact may lie at the boundary between the two stress liners.

In some aspects, the overlap in stress liners may occur over a gate structure, which may be an interconnect gate structure having an isolation region underneath or a transistor gate structure having a channel region underneath.

In some aspects, an insulating film, such as an inter-layer dielectric, may be deposited over the stress liners before the polishing, thereby resulting in a height equal to (or substantially equal to, depending on effectiveness and level-ness of polishing) that of the first stress liner. Another insulating film (of the same material, or different) may be deposited after the polishing.

DETAILED DESCRIPTION

Figure 1:
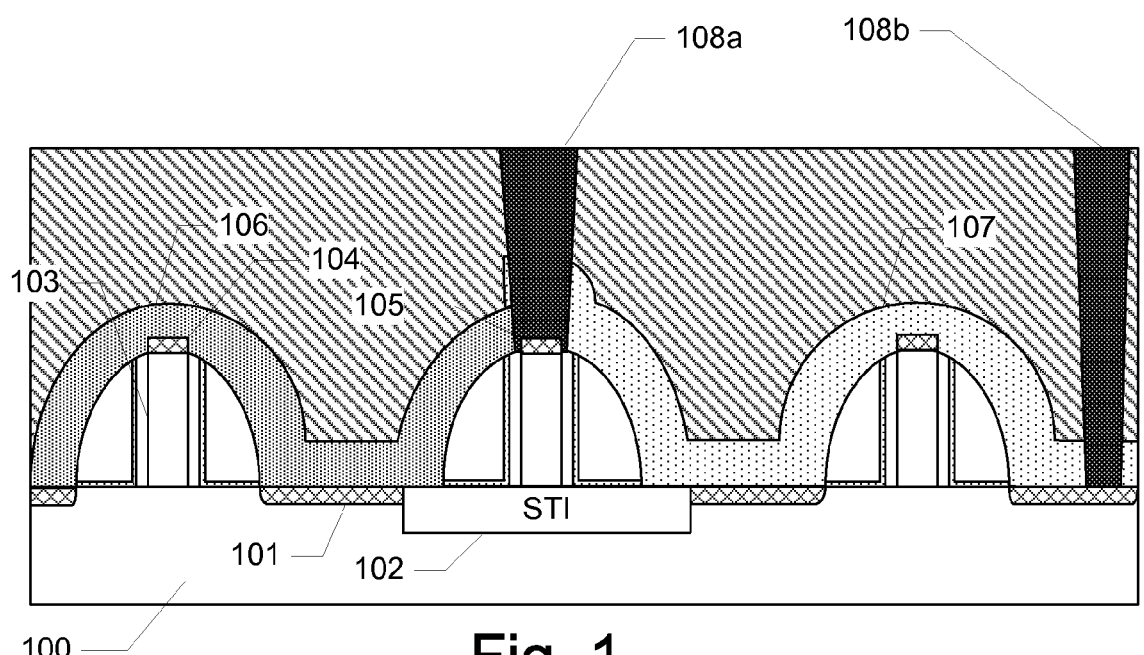
FIG. 1 illustrates an example of a dual stress liner structure semiconductor device.
Figure 2A:
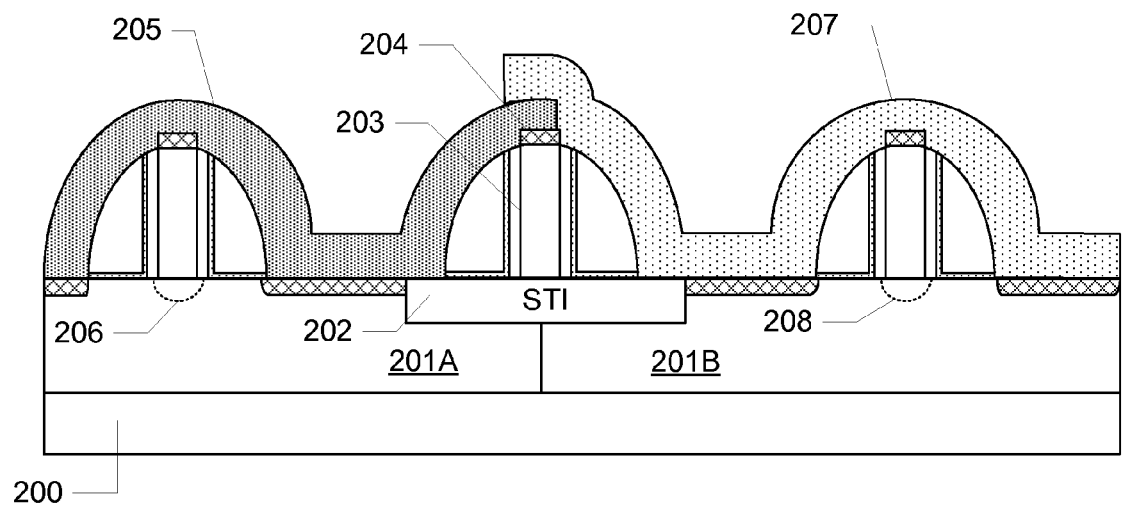
FIGS. 2A-E illustrate steps used to create a dual stress liner structure employing features described herein.

As illustrated in FIG. 2A, a silicon layer 200 (which may be, for example, a bulk silicon substrate or part of a silicon-on-oxide configuration) may have p- and n-type wells 201A, 201B, respectively, formed through any desired implantation process, such as ion implantation. Isolation structure 202 may be formed as a shallow trench isolation (STI) structure by, for example, depositing silicon dioxide ($SiO_2$) in trenches formed in the silicon layer 200, to electrically isolate circuit elements, such as FETs, from each other. Transistor and/or interconnect structures, such as gate interconnect 203 and silicide 204, may be formed throughout the regions in any desired manner as well. Gate interconnect 203, and the gates of the NFET and the PFET, may be formed of a conductive material such as polycrystalline silicon, also known as polysilicon.

A tensile stress liner 205 may be deposited over some or all of the p-well. The tensile stress liner 205 may be a silicon nitride (SiN) film, and may be deposited in a conventional manner or any other manner. The tensile stress liner 205 may further overlay NFET structures and interconnect structures, as shown in FIG. 2A. The tensile stress liner 205 has a crystalline lattice structure that, when on the silicon layer 200, tends to cause the lattice structure of that portion of the silicon layer 200 at the interface to shrink in an attempt to align with the relatively smaller lattice structure of the tensile stress liner 205. This shrinking causes a tension in the channel region between the wells of a device, such as channel region 206.

After the tensile stress liner 205 is formed, a compressive stress liner 207 may be formed over some or all of the n-well 201B. The compressive stress liner 207 may be a doped silicon nitride (SiN) film, as is known in the art. The compressive stress liner 207 has a relatively large lattice structure that, when formed on silicon layer 200, causes that portion of the relatively smaller lattice structure of the silicon layer 200 at the liner/silicon interface to expand. This expansion causes a corresponding compression in the channel forming region 208 of the PFET.

By the addition of these stress liners 205,207, the region of the device under the tensile stress liner 205 may be used to form n-type devices, such as an NFET, while the region of the device under the compressive stress liner 207 may be used to form p-type devices, such as a PFET. The compressive stress liner 207 is deposited so that it overlaps a portion of the tensile stress liner 205 at a boundary between the two regions of the device. The overlapping area may be disposed over a gate interconnect structure that can be used for interconnecting devices on the substrate 200.

Figure 2B:
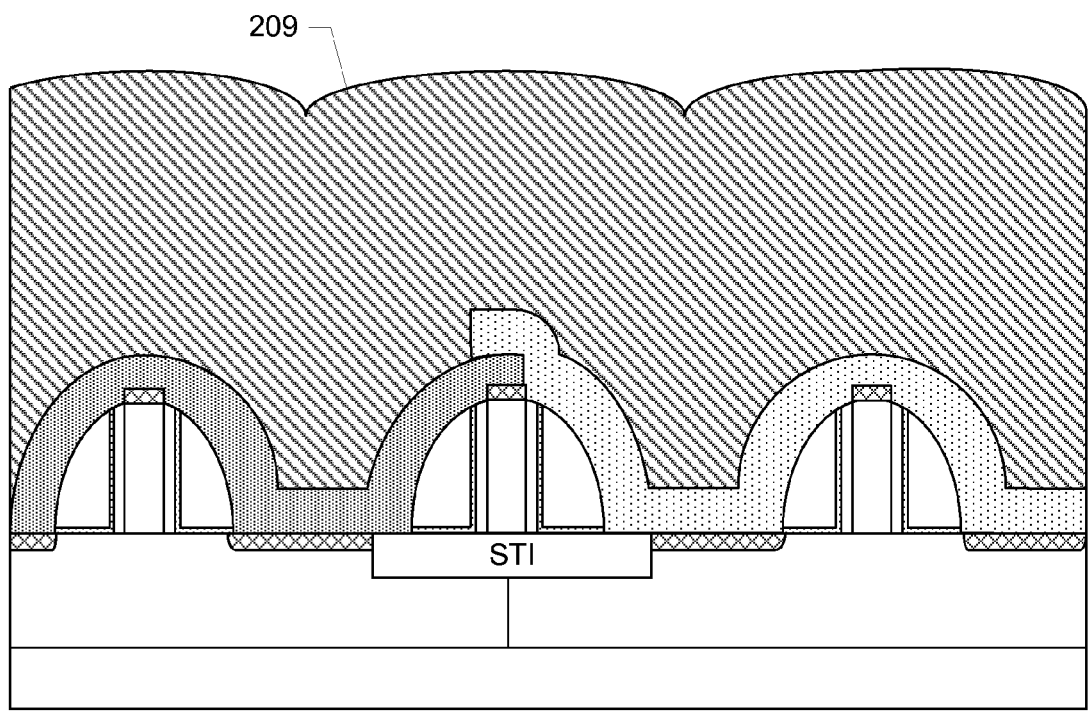
Figure 2C:
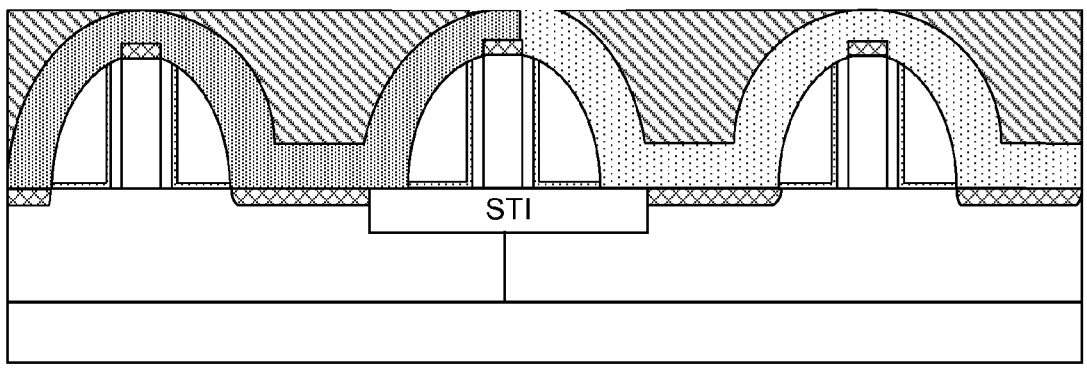

When the two stress liners are formed, an insulating film 209, such as undoped silicon dioxide may be deposited to cover the surface of the device, as shown in FIG. 2B. The insulating film may be formed by any desired process (e.g., chemical vapor deposition, sputtering, etc.), and after the insulating film 209 is formed, it may be polished back through any desired polishing technique, such as chemical mechanical polishing (CMP). In this CMP technique, and as shown in FIG. 2C, the first stress film (e.g., tensile film 205) and a portion of the second stress film 207 may be used as a stopper, such that the CMP stops when it reaches that first stress liner. The polishing process may be stopped by detecting surface level differences in the film 207 between portions overlapping film 205 and other portions, such as the portion over STI 202.

The polishing process may continue until the overlapping portion of the second stress film (e.g., film 207) is removed over the gate structure area. Other portions of this film 207, such as the portions over the STI 202 or transistor source/drain regions may remain in place.

Figure 2D:
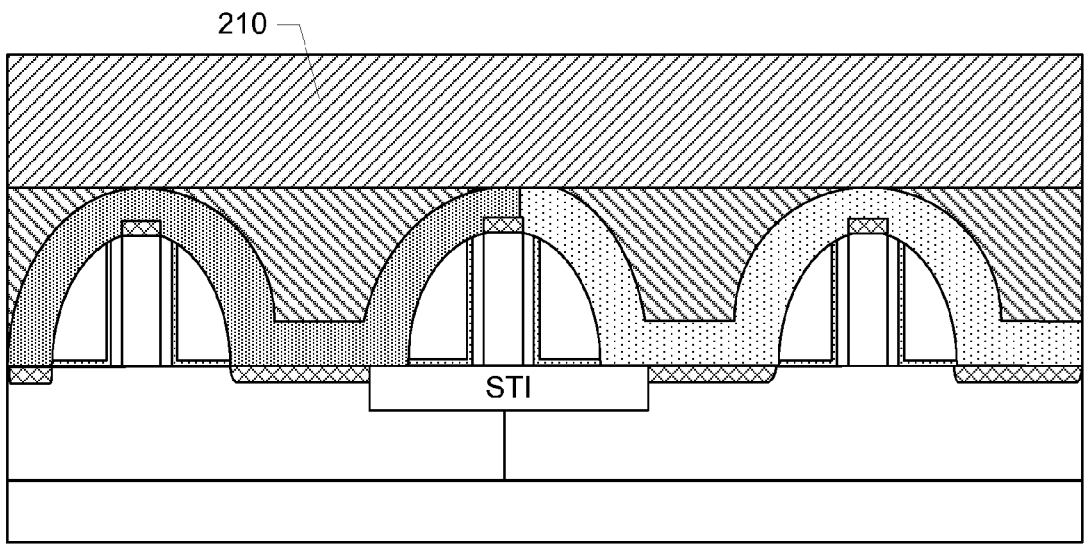

When the polishing is completed and the device is subsequently cleaned, a second insulating film 210 may be deposited over the first 209, such as shown in FIG. 2D. The second insulating film 210 may be of the same material as the first, or it may be a different material as desired. The second insulating film 210 may also be polished, if desired.

Figure 2E:
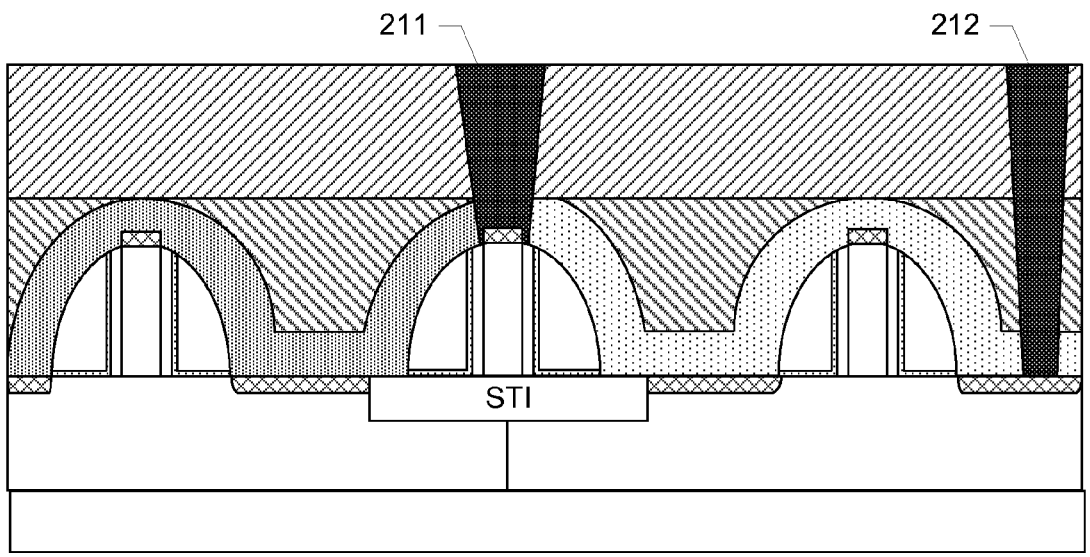

After the second insulating film is deposited, conductive contacts, such as contacts 211, 212, may then be formed to electrically connect with various gate structures, as shown in FIG. 2E. These contacts 211, 212 may be formed using an etching process (e.g., reactive ion etching) and subsequent metal deposition process. Although only two contacts are illustrated, any number of contacts may be formed as needed to reach the gate structures in the device. This etching process may be more easily accomplished in view of the fact that the overlapping stress liner was removed.

The description above illustrates examples of features described herein, but are merely examples, and other alternatives are also possible. For example, FIG. 2A illustrates a tensile film 205 being deposited first, followed by the compression film 207. As an alternative, these films may be deposited in reverse order, or on opposite ends of the device shown, and the regions of the device may be designated to be for different types of devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim the following:

1. A method of manufacturing a semiconductor device, comprising the steps of:
    depositing a first stress liner on a silicon layer;
    depositing a second stress liner on the silicon layer, wherein a portion of said second stress liner overlaps a portion of said first stress liner above a top of an interconnect structure;
    polishing said second stress liner to remove only said portion of said second stress liner overlapping said portion of said first stress liner above the top of the interconnect structure, wherein said polishing uses said first stress liner and a portion of the second stress liner as a stopper, and wherein said polishing leaves the first stress liner above the interconnect structure; and
    forming first and second conductive contacts through said first and second stress liners, respectively.

2. The method of claim 1, further comprising the step of embedding an oxide layer in the silicon layer under said conductive interconnect structure.

3. The method of claim 1, further comprising the step of forming a third contact through the first and second stress liners to electrically contact said conductive interconnect structure.

4. The method of claim 1, further comprising the step of depositing an insulating film over said first and second stress liners before said step of polishing.

5. The method of claim 4, further comprising the step of depositing a second insulating film over said first insulating film after said step of polishing and before said step of forming said first and second contacts.

6. The method of claim 1, wherein said first stress liner is a tensile stress liner and said second stress liner is a compressive stress liner.

7. The method of claim 6, wherein said stress liners are SiN stress liners.

8. A method of manufacturing a semiconductor device, comprising the steps of:
    forming first and second pluralities of transistor wells on a semiconductor substrate;
    depositing a first stress liner contacting said first plurality of said wells;
    depositing a second stress liner contacting said second plurality of said wells, wherein a portion of said second stress liner overlaps a portion of said first stress liner above a top of an interconnect structure;
    depositing a first insulating film on said stress liners;
    polishing said first insulating film and said second stress liner to remove only said portion of said second stress liner overlapping said portion of said first stress liner above the top of the interconnect structure, wherein said polishing uses said first stress liner and a portion of the second stress liner as a stopper, and wherein said polishing leaves the first stress liner above the interconnect structure;
    depositing a second insulating film on said first insulating film after said polishing;
    forming first and second contacts through said first and second stress liners, respectively.

9. The method of claim 8, wherein said step of forming first and second contacts further comprises the step of forming a trench through both of said insulating films and only one of said stress liners to reach first and second ones of said wells, respectively.

10. The method of claim 8, further comprising the step of forming a third contact through at least said second insulating film to reach a gate structure on said device, wherein said contact contacts said first stress liner on a first side, and said second stress liner on a second side.

11. The method of claim 10, wherein said contact directly contacts said first and second stress liners.

12. The method of claim 10, wherein said gate structure separates said semiconductor into n-type and p-type device regions.

13. The method of claim 1, wherein said first stress liner applies a first type of stress on the silicon layer, and said second stress liner applies a second type of stress, opposite the first type of stress, on the silicon layer.

14. The method of claim 1, wherein the first stress liner used as a stopper lies over a second interconnect structure, and the portion of the second stress liner used as a stopper lies over a third interconnect structure.

15. The method of claim 8, wherein one of said stress liners is a tensile stress liner, and the other of said stress liners is a compression stress liner.

16. The method of claim 8, wherein the first stress liner used as a stopper lies over a second interconnect structure, and the portion of the second stress liner used as a stopper lies over a third interconnect structure.

17. The method of claim 14, wherein said polishing leaves the first stress liner over the second interconnect structure and leaves the second stress liner over the third interconnect structure.

18. The method of claim 14, wherein said depositing a first stress liner deposits the first stress liner to continuously extend above the second interconnect structure, above the silicon layer, and above the interconnect structure, and said depositing a second stress liner deposits the second stress liner to continuously extend above the third interconnect structure, above the silicon layer, and above the portion of the first stress liner above the interconnect structure.

19. The method of claim 16, wherein said polishing leaves the first stress liner over the second interconnect structure and leaves the second stress liner over the third interconnect structure.

20. The method of claim 16, wherein said depositing a first stress liner deposits the first stress liner to continuously extend above the second interconnect structure, above the silicon layer, and above the interconnect structure, and said depositing a second stress liner deposits the second stress liner to continuously extend above the third interconnect structure, above the silicon layer, and above the portion of the first stress liner above the interconnect structure.

\* \* \* \* \*